United States Patent

Uemura et al.

[11] Patent Number: 5,821,003
[45] Date of Patent: Oct. 13, 1998

[54] ORGANIC ELECTROLUMINESCENT DEVICE

[75] Inventors: Takashi Uemura; Hiroya Kimura; Nobuyuki Okuda; Yoshinobu Ueba; Yasuko Okuda; Hajime Osaka, all of Osaka, Japan

[73] Assignee: Sumitomo Electric Industries, Ltd., Osaka, Japan

[21] Appl. No.: 716,871

[22] Filed: Sep. 20, 1996

Related U.S. Application Data

[63] Continuation-in-part of Ser. No. 545,857, filed as PCT/JP95/00436 Mar. 15, 1995 published as WO95/25149 Sep. 21, 1995, abandoned.

[30] Foreign Application Priority Data

Mar. 16, 1994 [JP] Japan .................................. 6-045605

[51] Int. Cl.⁶ .................................................. H05B 33/00
[52] U.S. Cl. ......................... 428/690; 428/917; 313/504
[58] Field of Search .................... 428/690, 917; 313/504

[56] References Cited

U.S. PATENT DOCUMENTS

| | | | |
|---|---|---|---|
| 5,232,800 | 8/1993 | Pavlisko et al. | 432/58 |
| 5,346,752 | 9/1994 | Sawada et al. | 428/216 |
| 5,427,858 | 6/1995 | Nakamura | 428/421 |
| 5,504,183 | 4/1996 | Shi et al. | 528/272 |
| 5,505,985 | 4/1996 | Nakamura | 427/66 |

FOREIGN PATENT DOCUMENTS

| | | |
|---|---|---|
| 2-242879 | 9/1990 | Japan . |
| 4-85389 | 3/1992 | Japan . |
| 5-25473 | 2/1993 | Japan . |
| 5-8346 | 2/1993 | Japan . |
| 5-152072 | 6/1993 | Japan . |
| 5-194943 | 8/1993 | Japan . |
| 6-122277 | 5/1994 | Japan . |
| 6-290268 | 10/1994 | Japan . |
| 7-58363 | 3/1995 | Japan . |

OTHER PUBLICATIONS

Japanese J. Appl. Physical, vol. 31, (1992, pp. 960–962, Part 2, No. 7B, Jul. 15, 1992 entitled "Molecularly Doped Polymers as a Hole Transport Layer in Organic Electroluminescent Devices" by Kido et al.

*Primary Examiner*—Charles Nold
*Attorney, Agent, or Firm*—Beveridge, DeGrandi, Weilacher & Young, L.L.P.

[57] ABSTRACT

An organic electroluminescent device having the hole-transport layer in which the hole-transport material is dispersed in the resin binder having a glass transition temperature of not less than 170° C.

Since the above organic electroluminescent device has the hole-transport layer exhibiting sufficient durability and higher hole-transport property, it is excellent in luminous efficiency, luminance and stability.

15 Claims, 9 Drawing Sheets

ORGANIC ELECTROLUMINESCENT DEVICE

This application is a continuation-in-part of application Ser. No. 08/545,857, filed Nov. 6, 1995 abandoned, which application represents the national stage of PCT /JP95/ 00436 having the international filing date of Mar. 15, 1995 and which are entirely incorporated herein by reference.

TECHNICAL FIELD

The present invention relates to organic electroluminescent device.

BACKGROUND ART

It has been considered that light emission of an organic electroluminescent device is caused by the phenomenon where holes and electrons injected from electrodes are recombined within a luminescent layer to generate excitons, and the excitons excite molecules of luminescent materials constituting the luminescent layer. By employing fluorescent dye as a luminescent material, there can be obtained an emission spectrum as an electroluminescence, being equivalent to photoluminescence of the dye molecules.

Tang and Vanslyke recently proposed a device comprising two layers of a hole-transport layer and an electron-transport luminescent layer which efficiently emits green light at a lower voltage (about 10 V) compared with the conventional organic electroluminescent devices having single-layer structure [C. W. Tang and S. A. Vanslyke; Appl. Phys. Lett., 51 (1987) 913]. This device's structure is composed of an anode, a hole-transport layer, an electron-transport luminescent layer and a cathode, all of which are formed in this order on a glass substrate.

In this device, the hole-transport layer not only allows holes to be injected from the anode into the electron-transport luminescent layer, but prevents electrons injected from the cathode from escaping into the anode without recombining with the holes, so that the electrons are enclosed in the electron-transport luminescent layer. Thus, the electron confinement effect due to the hole-transport layer facilitates the recombination of the holes and the electrons compared with the conventional single-layer structure devices, resulting in substantial decrease in drive voltage.

Saito et al. showed that not only an electron-transport layer but a hole-transport layer can be the luminescent layer in the two-layer structure device [C. Adachi, T. Tsutsui and S. Saito; Appl. Phys. Lett., 55 (1989) 1489].

Saito et al. also proposed an organic electroluminescent device having the three-layer structure wherein an organic luminescent layer is interposed between a hole-transport layer and an electron-transport layer [C. Adachi, S. Tokito, T. Tsutsui and S. Saito; Jpn. J. Appl. Phys., 27 (1988) L269].

The two-layer structure device of Saito et al. is composed of an anode, a hole-transport luminescent layer, an electron-transport layer and a cathode, all of which are formed in this order on a glass substrate. In contrast to the previous device, the electron-transport layer not only allows electrons to be injected from the cathode into the hole-transport luminescent layer, but prevents the holes injected from the anode from escaping into the cathode while avoiding the recombination with the electrons, so that the holes are enclosed in the hole-transport luminescent layer. This hole confinement effect due to the electron-transport layer realizes substantial decrease in drive voltage, as in the previous device.

The three-layer structure device of Saito et al. was attained by a further improvement in the device of Tang et al. The three-layer structure device is composed of an anode, a hole-transport layer, a luminescent layer, an electron-transport layer and a cathode, all of which are formed in this order on a glass substrate. The hole-transport layer encloses electrons in the luminescent layer, and the electron-transport layer encloses holes in the luminescent layer, so that the recombination of the electrons and the holes within the luminescent layer is more efficient than the two-layer structure device. Further, the electron-transport layer and the hole-transport layer prevent excitons generated by the above recombination from escaping into either the anode or the cathode. Therefore, the three-layer structure device of Saito et al. may further increase the luminous efficiency.

Examples of hole-transport materials which constitute these organic electroluminescent devices include aromatic tertiary amines such as triphenylamines, phthalocyanines, polysilane and the like. Among those, the aromatic tertiary amines represented by N,N'-diphenyl-N,N'-bis(3-methylphenyl)-1,1'-biphenyl-4,4'-diamine (hereinafter referred to as "TPD") of the formula:

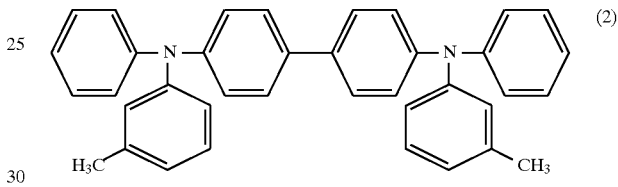

(2)

is suitably used because they have higher hole-transport properties. For example, the hole mobility of the TPD is $10^{-3}[cm^2/V \cdot sec]$ at an electric field strength of $5 \times 10^5$ [V/cm].

The hole-transport layers can be prepared by forming a layer containing the above hole-transport material alone, or by dispersing the above hole-transport material into a binder resin made of a suitable thermoplastic resin such as polycarbonate.

The organic electroluminescent devices as described have the advantages that they can emit light of high luminance at a lower voltage than the conventional inorganic electroluminescent devices, that the respective layers can be formed not only by deposition but also solution application, facilitating the large-area formation of the devices, and that it is possible to make the devices have multi-color depending upon the molecular design for organic molecules.

Particularly, the organic electroluminescent device having the hole-transport layer composed of the hole-transport material having higher hole-transport property, is excellent both in the initial luminescence and the initial luminous efficiency. In this device, however, the luminous efficiency and the luminescence decrease in significantly short-term from the start of the use. This involves the disadvantages in light emitting time and stability. As a reason for this, it is estimated that all the conventional hole-transport materials described above have a lower molecular weight, a lower glass transition temperature (e.g. Tg=63° C. for TPD), a lower crystallization temperature, and insufficient thermal properties.

Specifically, the hole-transport materials that have a lower molecular weight and poor thermal properties may facilitate the deterioration of the material itself and the formation of exciplex along with a luminescent material, both of which are caused by Joule's heat generated when a current flows to the device. This lowers the luminous efficiency of the device, thus decreasing its luminance.

In the organic electroluminescent devices, the interface between two organic layers and that between an organic layer and an electrode layer are required to be finished as smooth as possible in order to increase the carrier injection efficiency. For this reason, each organic layer is in amorphous state, though, a hole-transport material having a lower molecular weight has a lower crystallization temperature. This would facilitate the development of the molecular cohesion due to the Joule's heat or a prolonged standing in the atmosphere. As a result, the smoothness of the interfaces between the hole-transport layer and another layer would be impaired by the crystallization of the hole-transport material contained in the hole-transport layer, lowering the carrier-injection efficiency. This would lead to the decrease in luminous efficiency of the device, thus decreasing its luminance.

The above phenomenon notably occurs in the hole-transport layers which employs the hole-transport material alone. The same is true for the hole-transport layers in which the hole-transport material is dispersed in a resin binder composed of a thermoplastic resin. As a reason for this, it is estimated that the thermal properties of the thermoplastic resin itself, particularly its glass transition temperature, is significantly low (not as low as the hole-transport material), and therefore, the hole-transport material can move relatively freely in the hole-transport layer owing to heat generated in light emitting.

Although poly-N-vinyl carbazole (Tg=224° C.) (hereinafter referred to as "PVK") is known to have a higher molecular weight and hole-transport property, its hole-transport property is still lower than that of the hole-transport materials having a lower molecular weight, such as TPD. For the organic electroluminescent devices, it is preferable that the hole mobility is not less than $10^{-5}[cm^2/V \cdot sec]$ at a field strength of $5 \times 10^5[V/cm]$. That of the PVK is, however, $10^{-6}[cm^2/V \cdot sec]$ at a field strength of $5 \times 10^5[V/cm]$.

Extensive investigation have been undertaken in recent years to find materials, particularly hole-transport materials, in order to provide organic electroluminescent devices excellent in luminous efficiency, luminance and stability. As a result, there have been proposed the organic electroluminescent devices employing several hole-transport materials having specific structures.

Japanese Unexamined Publication No. 5-25473 (1993) describes that organic electroluminescent devices, which can be drive at low voltage and have high luminous intensity and are superior in durability, can be obtained by employing the specific fluorenyldiphenyl amine derivative expressed by the formula (1) in this Publication, as a hole-transport material (see page 4, column 6, lines 44–49).

Japanese Unexamined Publication No. 5-152072 (1993) describes that the specific oxadiazole compounds having plural oxadiazole rings (e.g. Compounds expressed in Chemical formulas 1–14 on pages 2–5 in this Publication) are excellent in layer forming properties and resist the crystallization, and therefore, by employing these oxadiazole compounds as a hole-transport material, the organic electroluminescent devices excellent in durability can be obtained (see page 6, column 10, lines 20–35).

Japanese Unexamined Publication No. 5-194943 (1993) describes that the specific distyryl benzene derivatives expressed by the formula (I) or (II) in this Publication, whose glass transforming temperature and melting point are high, and therefore, by employing these distyryl benzenes as a hole-transport material, the organic electroluminescent devices having long lifetime can be obtained (see page 3, column 4, lines 2–6).

All the hole-transport material disclosed in these Publications have heat durability superior to that of the conventional hole-transport materials, such as the TPD. Therefore, the organic electroluminescent devices employing the individual hole-transport materials have stability superior to that of the conventional ones. These hole-transport materials, however, belong to the compound whose molecular weight is smaller than that of the PVK. Thus in the organic electroluminescent devices employing these hole-transport material, the stability for practical use could not yet be attained. Some of these hole-transport materials have the problem that the hole-transport property is lower than that of the conventional ones, such as the TPD.

The object of the present invention is to provide the organic electroluminescent device having the hole-transport layer which has sufficient durability, high hole-transport property and is excellent in luminous efficiency, luminance and stability.

DISCLOSURE OF THE INVENTION

The organic electroluminescent device of this invention has the hole-transport layer in which a hole-transport material is dispersed into a resin binder having a glass transition temperature (Tg) of not less than 170° C.

In the above device, since the hole-transport layer is formed by dispersing the hole-transport material into the resin binder which is excellent in thermal property because of its high Tg, the hole-transport material is not crystallized due to molecular coagulation, thus remaining the smoothness of the interface between the hole-transport layer and another layer. Also, the above hole-transport material does not form exciplex together with a light emitting material.

Furthermore, the above hole-transport material is not required its thermal properties, as seen from the structure of the hole-transport layer. Therefore, a suitable one particularly excellent in hole-transport property can be selected from the above hole-transport materials such as the TPD.

Accordingly, in the present invention it is possible to form the organic hole-transport layer having superior durability and high hole-transport property, and to provide the organic electroluminescent devices excellent in luminous efficiency, luminance and stability.

PREFERRED EMBODIMENTS OF THE INVENTION

Figure 1A:
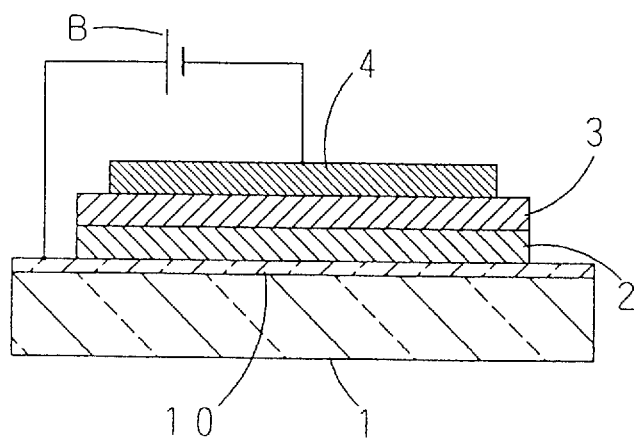
FIGS. 1(a) and 1(b) are sectional views illustrating one embodiment of the layer structure of the organic electroluminescent device of this invention.

In the organic electroluminescent device of this invention, the resin binder that constitutes the hole-transport layer and have a glass transition temperature (Tg) of not less than 170° C., can be selected from a variety of resin binders. Such resin binders, however, should be soluble in a solvent because in view of the layer forming costs, the hole-transport layer is preferably formed by solution application. Therefore, the hole-transport material and the resin binder are dissolved in a suitable solvent to prepare a coating solution, which is then applied to a substrate by spin coating or dip coating, followed by drying.

Examples of the resin binders being soluble in the solvents include polysulfone resins such as polyethelsulfone (Tg=225° C.), having the following repeating unit:

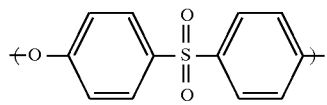
(1)

and polysulfone (Tg=190° C.) (the so-called "Udel polysulfone" (trademark), available from Amoco Performance Products, Tg=190° C.), having the following repeating unit:

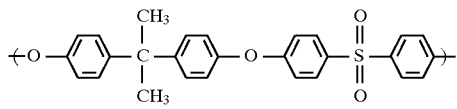
(3)

Most preferred is the above polyethersulfone. Because it has utmost Tg among the resins being soluble in a solvent (dichloromethane) and also exhibits superior layer forming property when it is used in solution application.

Besides the above polysulfone resins, there are, for example, polyimide resins such as wholly aromatic polyimide and polyetherimide. The Tg of the polyimide resins differs with each other depending upon the structures of the diamine component and the acid component which are the main ingredients of the polyimide resins, but normally it is about not less than 280° C. for the wholly aromatic polyimide and about 217° C. for the polyetherimide.

In many cases, the polyimide resins themselves are insoluble in solvents. Therefore, they are dissolved in the form of polyamide acid into a solvent together with a hole-transport material, the resulting solution is applied to a substrate and dried, and is subjected to ring closure reaction by heating or chemical method, resulting in polyimide.

The above resin binders can be used singly or by the combination of two or more kinds.

As exemplified compounds of the hole-transport materials dispersed into the above resin binders, there are, for example, without being limited thereto, aromatic tertiary amines, phthalocyanines and polysilanes. Out of these known hole-transport materials, one excellent in hole-transport property can be selectively used as previously mentioned. Most preferred is the aromatic tertiary amines represented by the TPD of the formula (2).

In the hole-transport layers as described, it is known that the hole-transport property for the entire hole-transport layer is greatly influenced by the distance between the molecules of the hole-transport material dispersed into the hole-transport layer, as well as the hole-transport property of the hole-transport material itself. Specifically, as the distance between the molecules decreases, the hole-transport property for the entire hole-transport increases.

In this invention, the hole-transport property for the entire hole-transport layer can be made any value by altering the distance between the molecules of the hole-transport material. This distance can be controlled by the amount of the hole-transport material.

The amount of the hole-transport material is not particularly limited in this invention, but preferably in an amount of 10–70% by weight (expressed by weight percentage to the entire hole-transport layer).

If it is less than 10% by weight, even though the hole-transport material itself is excellent in the hole-transport property, the hole-transport property for the entire hole-transport layer tends to be insufficient. If it exceeds 70% by weight, the relative proportion of the resin binder decreases, thus lowering the thermal property for the entire hole-transport layer. This might facilitate the aggregation and the crystallization of the hole-transport material, decreasing the film forming property.

In order to form the hole-transport layer that can stand Joule's heat generated when the device emits light, and have the hole mobility of not less than $10^{-5}[cm^2/V \cdot sec]$ at a field strength of $5 \times 10^5 [V/cm]$, the amount of the hole-transport material is preferably in a range of 40–60% by weight where around 50% by weight is preferred.

The thickness of the hole-transport layer is not particularly limited, but to secure the practical strength and hole-transport property, it is preferably in a range of about 100–100000 Å, particularly a range of 100–2000 Å where about 400–500 Å is preferred. The thickness can be controlled by altering the concentration of the coating solution and the application conditions or the like.

The above hole-transport layer is produced by the process comprising:

dissolving each given amount of the resin binder and the hole-transport material in a common solvent to prepare a coating solution; and applying the coating solution on a substrate by any known means, for example, spin coating and dip coating, followed by drying to remove the solvent.

The solvents used in the coating solution can be selected from ones in which both of the resin binder and the hole-transport material are soluble. But in view of their removal from the resulting layer, organic solvents having a relatively lower boiling point are suitably used.

Examples of the above solvents, without limited thereto, include dichloromethane, dichloroethane, tetrahydrofuran, acetonitrile, acetone, methanol, ethanol, carbon tetrachloride, carbon disulfide, benzene, toluene, hexane and octane.

Each of these solvents may be used as it is, however, it is preferred to remove dissolved gas in each solvent by freeze-degassing or bubbling of an inert gas through the solvent, in order to extend the lifetime of the devices. The reason for this appears that the solvent from which the dissolved gas has been removed prevent the individual materials used in the device from the deterioration (e.g. oxidation) due to the dissolved gas, particularly oxygen and moisture. From the same reason, the application of the coating solution and the drying are preferably carried out in an atmosphere in which oxygen and moisture are practical absent, (e.g., an inert gas atmosphere such as nitrogen gas).

In drying the coating solution applied to a substrate, when the solvent has a lower boiling point and the thickness of the layer is smaller, to dry at room temperature is suitable, in contrast, when the solvent has a higher boiling point and the thickness of the layer is larger, such a coating solution may be dried by heating.

The organic electroluminescent device of this invention does not have any structural restrictions on the respective layers but the hole-transport layer. The organic layer in the device may have the hole-transport layer alone, or may have any structures such as the conventional two-layer, and multi-layers comprising three or more layers.

In the two-layer or the multi-layer structure, the hole-transport layer may be combined with, for example, either or both of an electron-transport layer and a light emitting layer. Materials for both layers are not particularly limited. There can be selected from a variety of the conventional materials for the respective layers. The individual layers can be formed by vapor deposition such as vacuum deposition, or the aforesaid solution application. The thickness of the respective layers is not specifically limited.

Every layer including the hole-transport layer may contain other materials such as resin binders, curing agents, curing catalysts, antioxidants, ultraviolet ray absorbents and various additives, all of which do not directly relate to each layer's function.

No concrete restrictions on the layer structure are imposed in the organic electroluminescent device. But, if considered the facts that binder resins in the hole-transport layer is excellent in adhesion to the substrate such as ITO glass and ITO film, and that the hole-transport layer is exclusively formed by solution application, it is preferable that the device having the two-layer structure comprising the hole-transport layer and the electron-transport layer have the structure that the hole-transport layer 2 and the electron-transport layer 3 are laminated in this order on an anode 10 of a transparent conductive material such as ITO (indium-tin-oxide) being formed on a glass substrate 1, as shown in FIG. 1(a). In FIG. 1(a), the reference numerals 4 denotes a cathode made of metal deposited film such as Mg/Ag, and B denotes a power source for applying a drive voltage to the device.

In this structure, which emits light, the hole-transport layer or the electron-transport layer, depends upon the thickness, their materials, particularly how both layers are combined. In accordance with a desired luminescent wavelength, the thickness and the combination of their materials may be adjusted so that either or both layers emit light.

In the case where the hole-transport layer is allowed to emit light, by dispersing one or more kinds of the known fluorescence dyes into the resin binder, it is possible to improve the luminance of the luminous colors such as blue and white (it has been impossible to emit these colors at high luminance for long-term) up to the practical use and also to prolong their light emitting time.

Figure 1B:
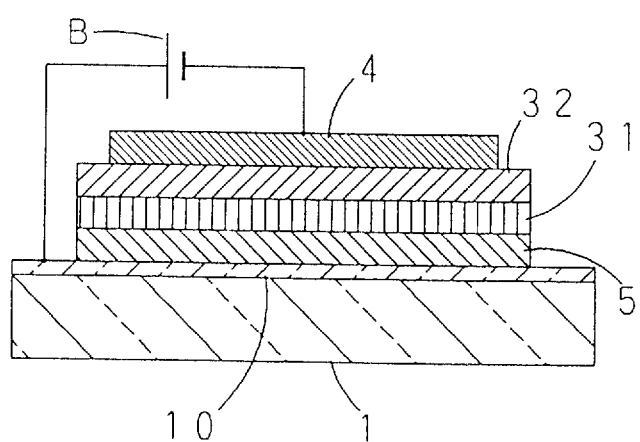

The device having the hole-transport layer in which a fluorescence dye is being dispersed may have the same layer structure as described above. However, in order to allow the fluorescent dye to emit light at still higher luminance, it is desirable to have the structure as shown in FIG. 1(b) in which the hole-transport layer 5 is combined with the electron-transport layer 31 composed of a first electron-transport material excellent in hole blocking property, and the electron-transport layer 32 composed of a second electron-transport material. In FIG. 1(b), the numeral references 1, 4 and 10 have the same meanings as in FIG. 1(a).

FIELD OF INDUSTRIAL APPLICABILITY

As described in the foregoing, the device of this invention has the hole-transport layer in which the hole-transport material is dispersed into the resin binder having a higher glass transition temperature, and it also has sufficient durability and high hole-transport property. Therefore, the above device is excellent in luminous efficiency, luminance and stability.

Thus in accordance with this invention, it is possible to improve the durability of the device and to prolong its lifetime, thus having a bright prospect of the applications in the fields of indications, illuminations, displays and the like.

EXAMPLES

The invention will be better understood by the following Examples and Comparative Example which show by way of example.

Example 1

Two-hundred mg of the TPD of the formula (2) as a hole-transport material and 200 mg of polyethersulfone (Tg=225° C.) having the repeating unit of the formula (1) are dissolved in 40 ml of dichloromethane, to obtain a coating solution for hole-transport layer.

Into the coating solution, an ITO (indium-tin-oxide) coated glass substrate having a sheet resistance of 15 Ω/□ (ITO thickness: 1500 to 1600 Å, available from Asahi Glass Co., Ltd.) was dipped and then subjected to dip-coating at a lifting-up speed of 10 cm/min., followed by drying, to form a hole-transport layer having a thickness of 400 Å on the ITO film in the substrate.

Then, onto this hole-transport layer, a tris(8-quinolinolato)aluminum (III) complex (hereinafter referred to as "Alq") of the formula:

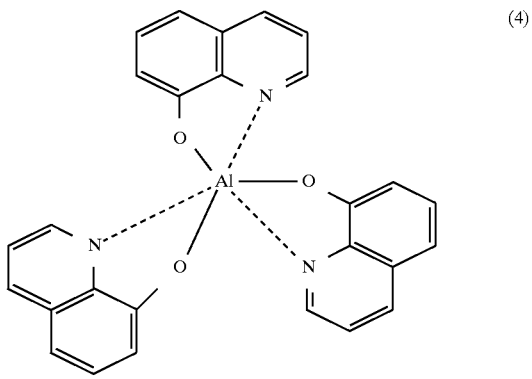

(4)

was deposited, as an electron-transport material, by vacuum deposition to laminate an electron-transport layer having a thickness of 500 Å. The deposition conditions were:

Vacuum pressure: $10^{-7}$ Torr;

Temperature of the substrate: Room temperature; and

Deposition rate: 2 to 4 Å/sec.

Then, on this electron-transport layer, magnesium and silver were codeposited at a deposition speed ratio of 10:1 to form an Mg/Ag electrode layer having a thickness of 2000 Å[Mg/Ag=10/1 (molar ratio)], to obtain an organic electroluminescent device in which the hole-transport layer 2, the electron-transport layer 3 and the Mg/Ag electrode layer (cathode) 4 were laminated in this order on the ITO film (anode) 10, as shown in FIG. 1(a). The luminescent region was expressed by a square being 0.5 cm in side.

In this device, the ITO film 10 and the Mg/Ag electrode layer 4 were used as an anode and a cathode, respectively, and a bias voltage B was applied between both electrodes at room temperature in air to allow the device to emit light. Its luminance was measured by a luminance meter (Model No. LS-100, available from Minolta Co., Ltd.). At a drive voltage of 12 V (current density: 1500 mA/cm$^2$), there was observed a green light emission having a luminance of 9000 cd/m$^2$, originated from the electron-transport layer 3.

Figure 2A:
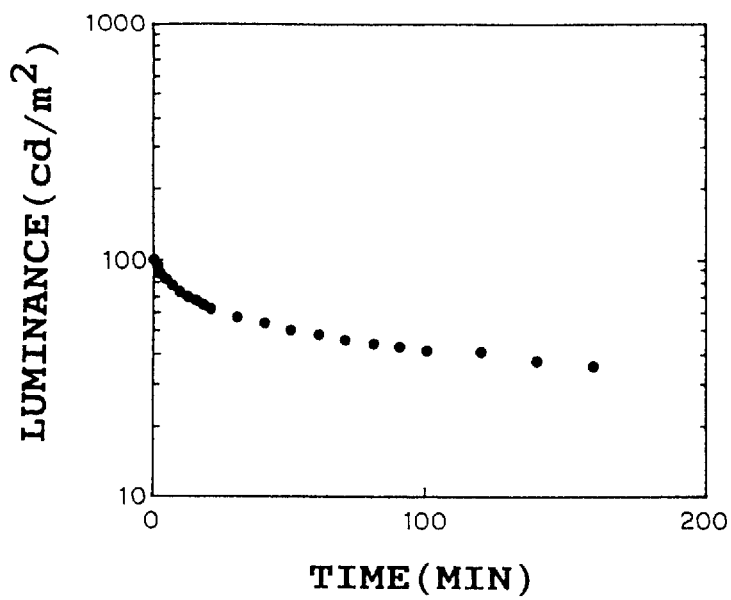
FIGS. 2(a) and 2(b) are graphs illustrating the alternation with the elapse of time in the luminance when the organic electroluminescent device of Example 1 or 2 is allowed to continuously emit light in air.
Figure 2B:
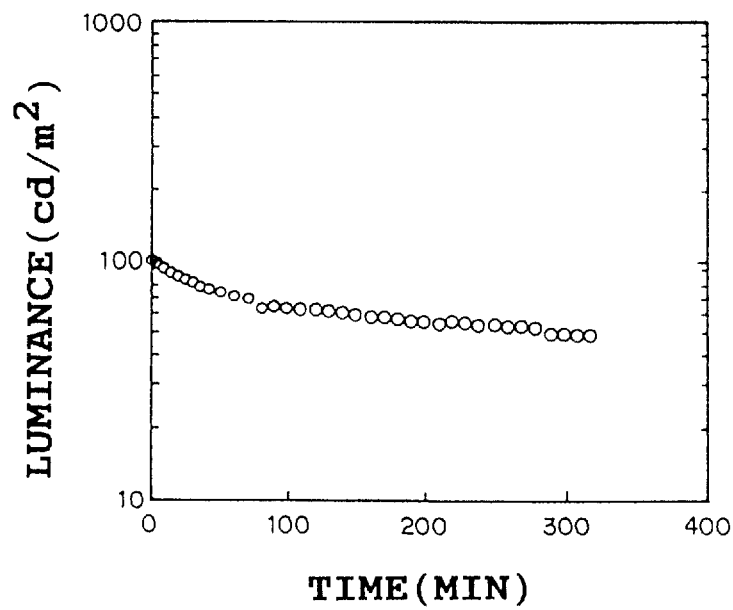

Also, this device was allowed to continuously emit light in air at an initial luminance of 100 cd/m$^2$. Its half decay time of the luminance (i.e., the period of time required to be 50 cd/m$^2$) was 315 min. as shown in FIG. 2(*b*).

Example 2

An organic electroluminescent device having the layer structure as shown in FIG. 1(*a*) was obtained in the same manner as in Example 1 except that 200 mg of polysulfone (Tg=190° C.) having the repeating unit of the formula (3) were used as a resin binder.

The luminance of this device was measured in the same manner as in Example 1. At a drive voltage of 12 V (current density: 1500 mA/cm$^2$), there was observed a green light emission having a luminance of 9000 cd/m$^2$, originated from the electron-transport layer 3.

Also, this device was allowed to continuously emit light in air at an initial luminance of 100 cd/m$^2$. Its half decay time of the luminance (i.e., the period of time required to be 50 cd/m$^2$) was 50 min. as shown in FIG. 2(*a*).

Comparative Example 1

An organic electroluminescent device having the layer structure as shown in FIG. 1(*a*) was obtained in the same manner as in Example 1 except that 200 mg of bisphenol A-type polycarbonate (Tg=150° C.) having the repeating unit of the formula:

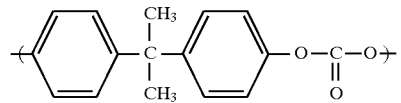

was used as a resin binder.

The luminance of this device was measured in the same manner as in Example 1. At a drive voltage of 12 V (current density: 1500 mA/cm$^2$), there was observed a green light emission having a luminance of 14000 cd/m$^2$, originated from the electron-transport layer 3.

Figure 3:
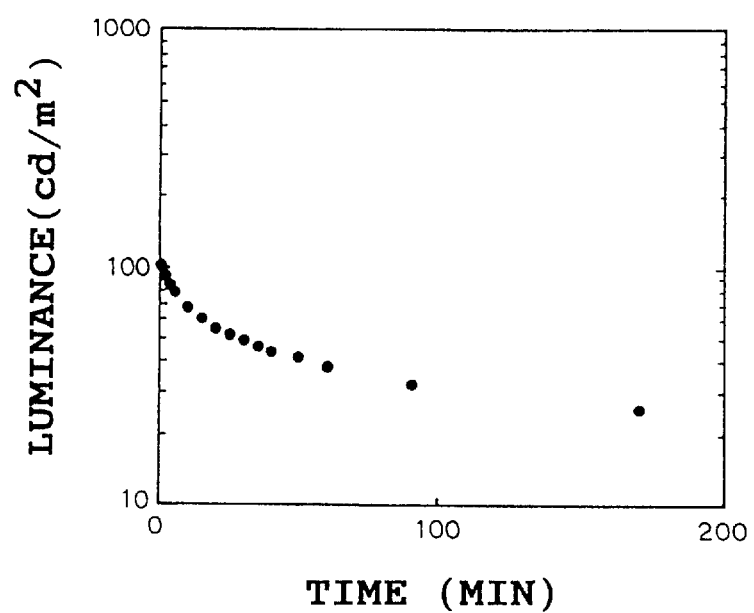
FIG. 3 is a graph illustrating the alternation with the elapse of time in the luminance when the organic electroluminescent device of Comparative Example 1 is allowed to continuously emit light in air.

Also, this device was allowed to continuously emit light in air at an initial luminance of 100 cd/m$^2$. Its half decay time of the luminance was 30 min. as shown in FIG. 3.

Comparative Example 2

An organic electroluminescent device having the layer structure as shown in FIG. 1(*a*) was obtained in the same manner as in Example 1 except that 200 mg of phenoxy resin (Tg=100° C.) having the repeating unit of the formula:

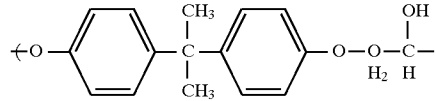

was used as a resin binder.

This device was allowed to continuously emit light in air at room temperature at an initial luminance of 100 cd/m$^2$, as in Example 1. Its half decay time of the luminance was two min.

Study of the Glass Transition Temperature in the Resin Binders

Figure 4:
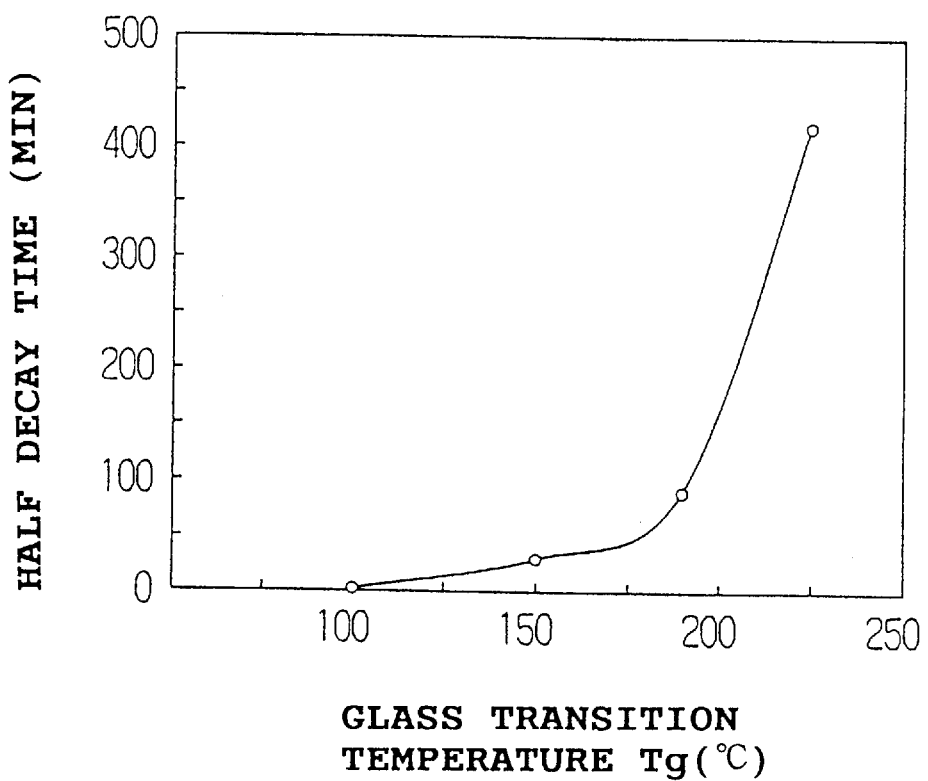
FIG. 4 is a graph illustrating the correlation between the glass transition temperature (Tg) of the resin binder and the half decay time of the device (device's lifetime), which was obtained from the measurement results for the devices of Examples 1–2 and Comparative Examples 1–2.

The correlation between the results of the half decay time (min) of luminance and the glass transition temperature (Tg) in Examples 1–2 and Comparative Examples 1–2 was studied, and it was found that the case where the resin binder having a Tg of not less than 170° C. was used, the half decay time was extremely longer than that in the case where the resin binder having a Tg of not more than 170° C. was used as shown in FIG. 4. This shows that the use of the resin binder having a Tg of not less than 170° C. enables to prolong the lifetime of the device.

Example 3

One-hundred fifty mg of the TPD of the formula (2) as a hole-transport material and 150 mg of polyethersulfone (Tg=225° C.) having the repeating unit of the formula (1) were dissolved in 30 ml of dichloromethane from which dissolved gas had been removed by three-time freeze-degassing, to obtain a coating solution for hole-transport layer.

Into this coating solution, an ITO (indium-tin-oxide) coated glass substrate having a sheet resistance of 15 Ω/□ (ITO thickness: 1500 to 1600 Å, available from Asahi Glass Co., Ltd.) was dipped and then subjected to dip-coating at a lifting-up speed of 10 cm/min., followed by drying, to form a hole-transport layer having a thickness of 400 Å on the ITO film in the substrate. 50% by weight of the TPD was present in the entire hole-transport layer.

Then, onto this hole-transport layer, the Alq of the formula (4) was deposited by vacuum deposition to form an electron-transport layer having a thickness of 600 Å. The deposition conditions were:

Vacuum pressure: 10$^{-6}$ Torr;

Temperature of the substitute: Room temperature; and

Deposition rate: 2 to 4 Å/sec.

Then, on this electron-transport layer, magnesium and silver were codeposited at a deposition rate ratio of 10:1 to form an Mg/Ag electrode layer having a thickness of 2000 Å[Mg/Ag=10/1 (molar ratio)], to obtain an organic electroluminescent device in which the hole-transport layer 2, the electron-transport layer 3 and the Mg/Ag electrode layer (cathode) 4 were laminated in this order on the ITO film (anode) 10, as shown in FIG. 1(*a*). The luminescent region was expressed by a square being 0.5 cm in side.

Figure 5:
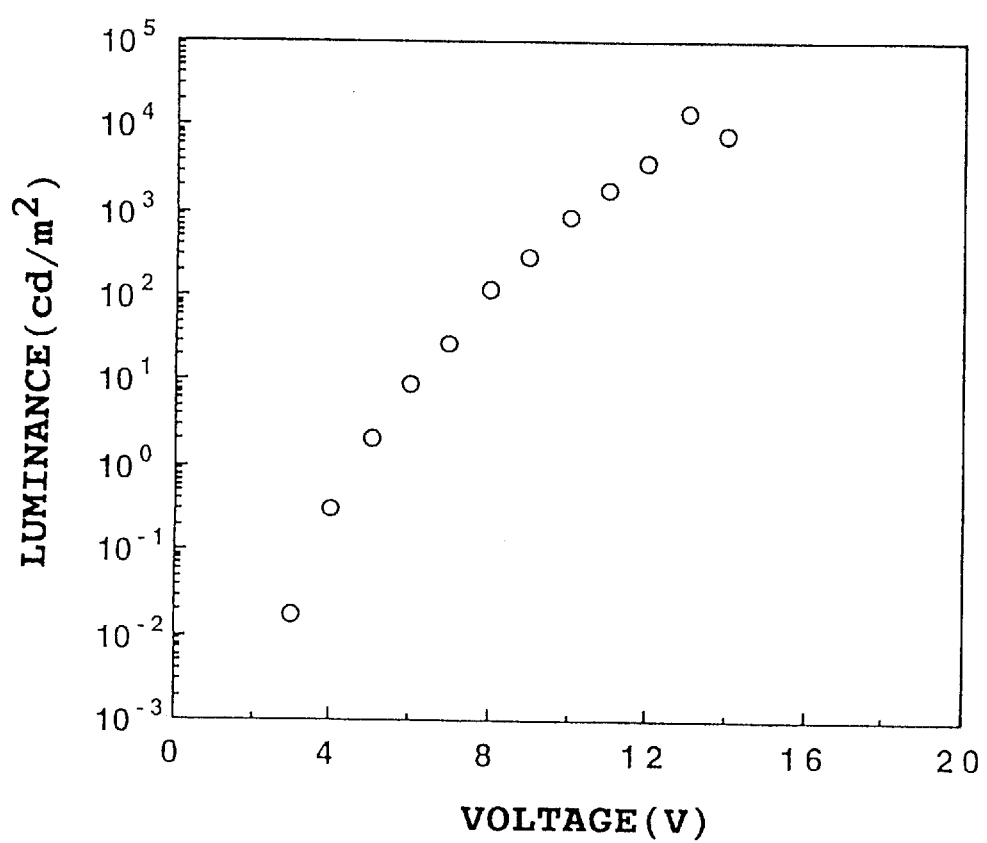
FIG. 5 is a graph illustrating the correlation between the voltage and the luminance in the device of Example 3.

In this device, the ITO film 10 and the Mg/Ag electrode layer 4 were used as an anode and a cathode, respectively, and a bias voltage B was applied between both electrodes at room temperature in air to allow the device to emit light. Its luminance was measured by the aforesaid luminance meter to obtain the correlation between the voltage and the luminance as shown in FIG. 5.

At a drive voltage of 13 V (current density: 625 mA/cm$^2$), there was observed a green light emission having a luminance of 9600 cd/m$^2$, originated from the electron-transport layer 3.

Also, this device was allowed to continuously emit light in a nitrogen atmosphere at a driving current density of 40 mA/cm$^2$ and an initial luminance of 900 cd/m$^2$. Its half decay time of the luminance (i.e., the period of time required to be 450 cd/m$^2$) was 15 hours.

Example 4

An organic electroluminescent device having the layer structure as shown in FIG. 1(*a*) was obtained in the same manner as in Example 3 except that 140 mg of the TPD as a hole-transport material and 70 mg of the polyethersulfone as a resin binder were used to prepare a coating solution for the hole-transport layer. 66.7% by weight of the TPD was present in the entire hole-transport layer.

Figure 6:
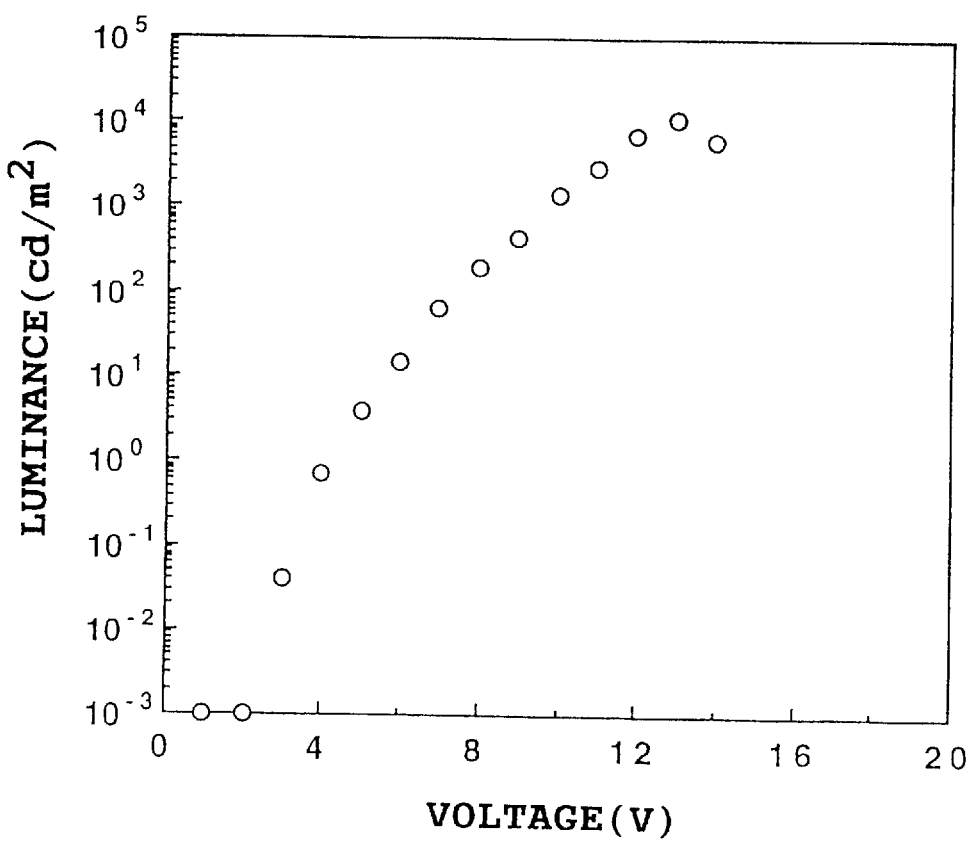
FIG. 6 is a graph illustrating the correlation between the voltage and the luminance in the device of Example 4.

The luminance of this device was measured in the same manner as in Example 3 to obtain the correlation between the voltage and the luminance as shown in FIG. 6. At a drive voltage of 13 V (current density: 720 mA/cm$^2$), there was observed a green light emission having a luminance of 11170 cd/m$^2$, originated from the electron-transport layer 3.

Also, this device was allowed to continuously emit light in nitrogen atmosphere at a current density of 40 mA/cm$^2$ and an initial luminance of 900 cd/m$^2$. Its half decay time of the luminance (i.e., the period of time required to be 450 cd/m$^2$) was five hours.

Example 5

An organic electroluminescent device having the layer structure as shown in FIG. 1(*a*) was obtained in the same manner as in Example 3 except that 70 mg of the TPD as a hole-transport material and 140 mg of the polyethersulfone as a resin binder were used. 33.3% by weight of the TPD was present in the entire hole-transport layer.

Figure 7:
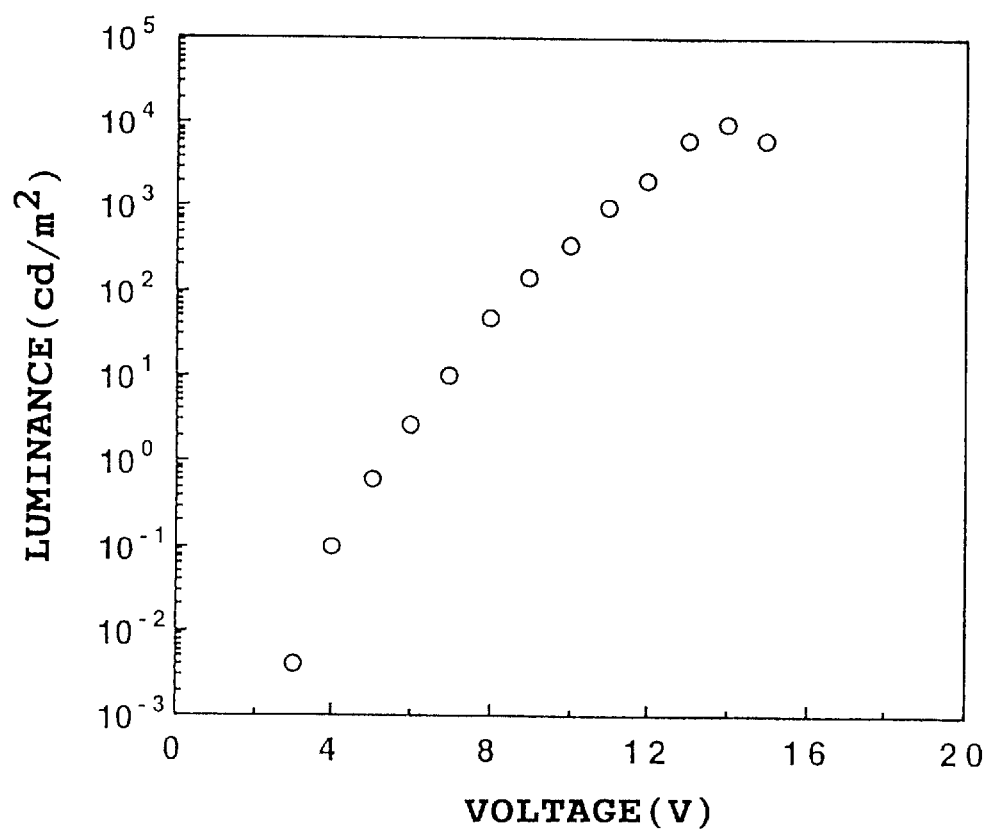
FIG. 7 is a graph illustrating the correlation between the voltage and the luminance in the device of Example 5.

The luminance of this device was measured in the same manner as in Example 3 to obtain the correlation between the voltage and the luminance as shown in FIG. 7. At a drive voltage of 14 V (current density: 800 mA/cm$^2$), there was observed a green light emission having a luminance of 11700 cd/m$^2$, originated from the electron-transport layer 3.

Also, this device was allowed to continuously emit light in nitrogen atmosphere at a driving current density of 40 mA/cm$^2$ and an initial luminance of 900 cd/m$^2$. Its half decay time of the luminance was 6.5 hours.

Example 6

An organic electroluminescent device having the layer structure as shown in FIG. 1(*a*) was obtained in the same manner as in Example 3 except that 30 mg of dichloromethane not subjected to freeze-degassing was used to prepare a coating solution for the hole-transport material.

The luminance of this device was measured in the same manner as in Example 3 to obtain the correlation between the voltage and the luminance. At a drive voltage of 12 V (current density: 555 mA/cm$^2$), there was observed a green light emission having a luminance of 9450 cd/m$^2$, originated from the electron-transport layer 3.

Also, this device was allowed to continuously emit light in nitrogen atmosphere at a driving current density of 40 mA/cm$^2$ and an initial luminance of 900 cd/m$^2$. Its half decay time of the luminance was determined to five hours.

Comparative Example 3

An organic electroluminescent device having the layer structure as shown in FIG. 1(*a*) was obtained in the same manner as in Example 3 except that the hole-transport layer was formed by depositing the TPD alone as a hole-transport material. Its thickness was 400 Å. The deposition conditions were:

Vacuum pressure: 10$^{-6}$ Torr;
Temperature of the substrate: Room temperature; and
Deposition rate: 2 to 4 Å/sec.

At a drive voltage of 14 V (current density: 550 mA/cm$^2$), there was observed a green light emission having a luminance of 12400 cd/m$^2$, originated from the electron-transport layer 3.

Also, this device was allowed to continuously emit light in nitrogen atmosphere at a driving current density of 40 mA/cm$^2$ and an initial luminance of 1000 cd/m$^2$. Its half decay time of the luminance (i.e., the period of time required to be 500 cd/m$^2$) was one hour.

Study of the Lifetime of the Devices

In comparison between Examples 3–5 which differ from each other in the proportion of the TPD in the hole-transport layer, it was found that although every Example had almost same values in drive voltage, current density and luminance, Example 3 having 50% by weight of the TPD had the longest lifetime.

In comparison among Example 3 employing the dichloromethane subjected to three-time freeze-degassing, Example 6 employing the dichloromethane not subjected to freeze-degassing, and Comparative Example 3 in which the hole-transport layer was formed by depositing the TPD alone, it was found that although they have almost same values in drive voltage, current density and luminance, the lifetime of Example 3 or 6 was longer than that of Comparative Example 3.

Further in comparison between Examples 3 and 6, it was found that the lifetime of Example 3 was longer than that of Example 6.

Figure 8:
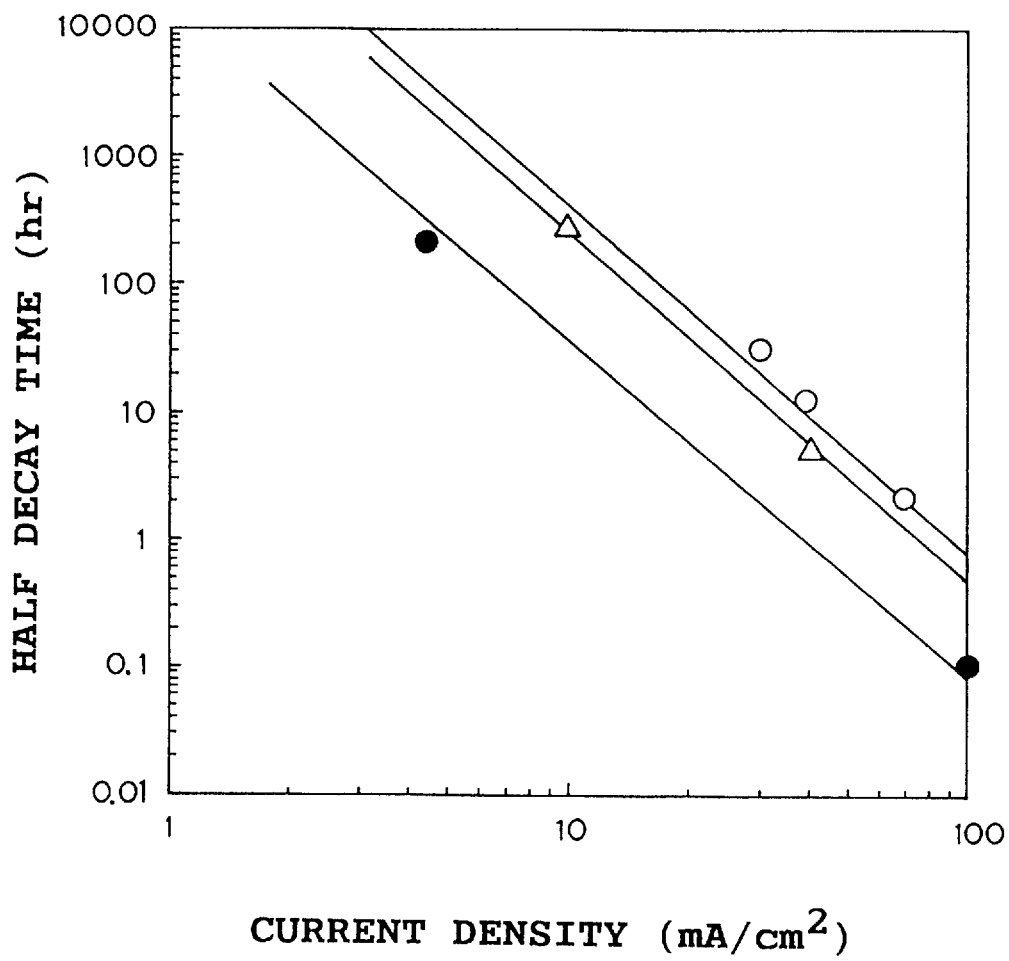
FIG. 8 is a graph illustrating the correlation between the drive current density and the half decay time (lifetime) in the devices of Examples 3, 6 and Comparative Example 3.

Using Examples 3, 6 and Comparative Example 3, each half decay time was determined in nitrogen atmosphere when altering drive current density. Then it was found that, as the driving current density was smaller, the half decay time was longer, resulting in a longer lifetime as shown in FIG. 8. In this figure, symbols "○", "Δ" and "●" denote Example 3, Example 6 and Comparative Example 3, respectively.

The correlation between the drive current density and the luminance obtained from the result in FIG. 8 showed that the lifetime of Examples 3 or 6 was longer than that of Comparative Example 3, and Example 3 was the longest, as illustrated by three solid lines.

Example 7

A coating solution for the hole-transport layer was prepared by dissolving, in 30 ml of dichloromethane, (a) 150 mg of the TPD
(b) 150 mg of polyestelsulfone
(c) 0.1 mg of tetraphenylbutadiene (hereinafter referred to as "TPB") as a fluorescent dye, which has a fluorescent wavelength of 440 nm and is expressed by the formula:

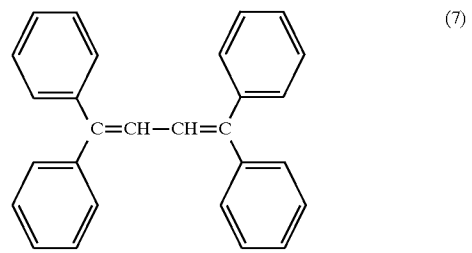

(7)

(d) 8.5 mg of coumarine 6 as a fluorescent dye, which has a fluorescent wavelength of 480 nm and is expressed by the formula:

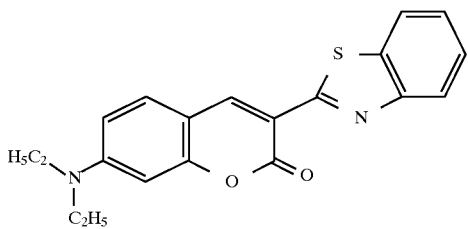

(e) 12 mg of 4-dicyanomethylene-2-methyl-6-p-dimethylaminostyryl-4H-pyran (hereinafter referred to as "DCM") as a fluorescent dye, which has a fluorescent wavelength of 550 nm and is expressed by the formula:

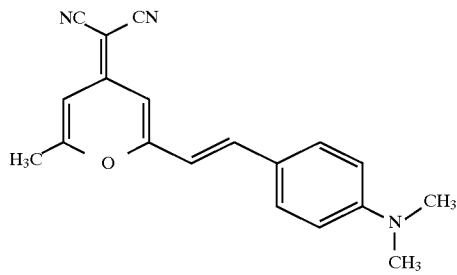

This coating solution was applied on an ITO (indium-tin-oxide) coated glass substrate (ITO thickness: 1500 to 1600 Å, as previously described) by dip coating at a lifting-up speed of 10 cm/min, followed by drying, to obtain a hole-transport layer wherein fluorescent dye was being dispersed. Its thickness was 500 Å.

Then, on the above hole-transport layer, (a) a triazole derivative of the formula:

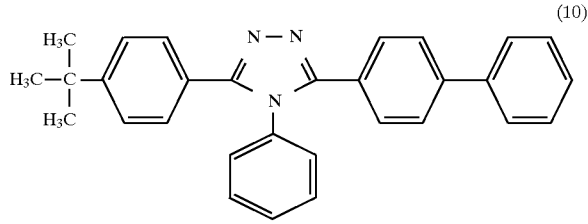

as a first electron-transport material excellent in hole blocking property, and (b) the Alq as a second electron-transport material were deposited in this order by vacuum deposition to form a first and second electron-transport layers.

The deposition conditions for these electron-transport layers were:

Vacuum pressure: $2 \times 10^{-5}$ Torr;
Temperature of the substrate: Room temperature; and
Deposition rate: 2 to 4 Å/sec.

The thicknesses of the first and the second electron-transport layers were 200 Å and 500 Å, respectively.

Then, on these electron-transport layers, magnesium and silver were codeposited at a deposition rate ratio of 10:1 to form an Mg/Ag electrode layer having a thickness of 2000 Å [Mg/Ag=10/1 (molar ratio)], to obtain an organic electroluminescent device in which the hole-transport layer 2, the first electron-transport layer 31, the second electron-transport layer 32 and the Mg/Ag electrode layer (cathode) 4 were laminated in this order on the ITO film (anode) 10, as shown in FIG. 1(b). The luminescent region was expressed by a square being 0.5 cm in side.

Figure 9:
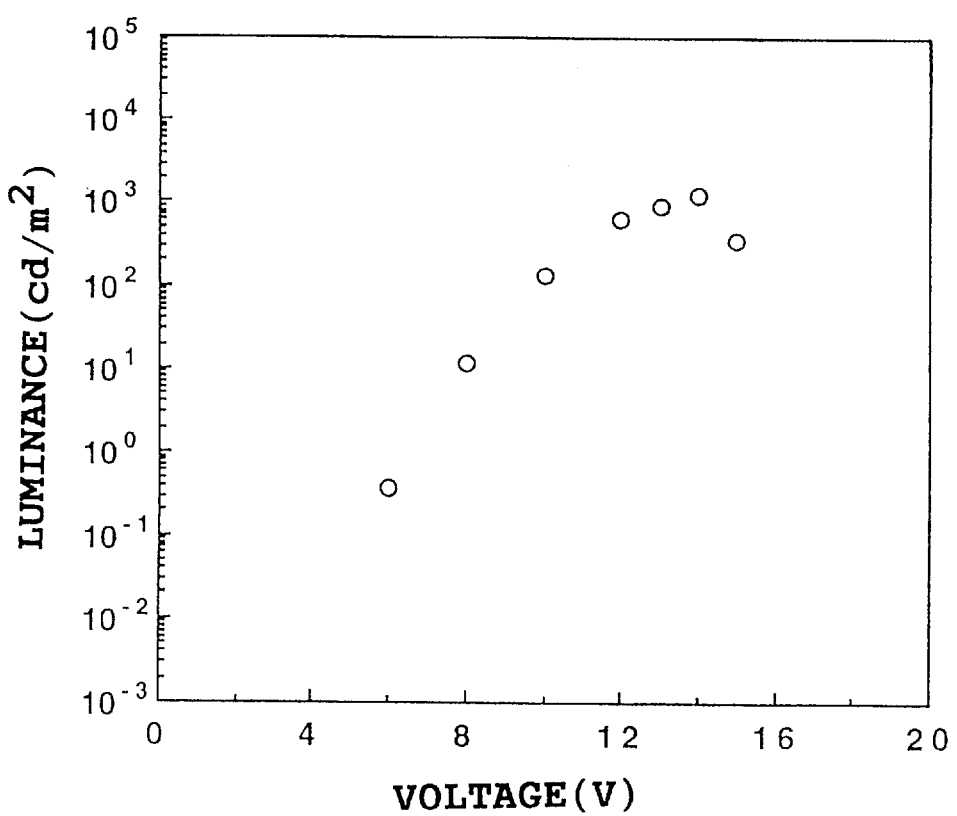
FIG. 9 is a graph illustrating the correlation between the voltage and the luminance in the device of Example 7.

In this device, the ITO film 10 and the Mg/Ag electrode layer 4 were used as an anode and a cathode, respectively, and a bias voltage B was applied between both electrodes at room temperature in air to allow the device to emit light. Its luminance was measured by the aforesaid luminance meter to obtain the correlation between the voltage and the luminance as illustrated in FIG. 9. At a drive voltage of 10 V (current density: 10 mA/cm$^2$), there was observed a white light emission originated from the hole-transport layer 5.

The CIE coordinate measurements for the above white light emission showed that X=0.34; Y=0.33, and it was confirmed that it was pure white. Even when the device was preserved at room temperature for one-month, its appearance remained unchanged, and its luminance was virtually invariant. This shows that this device was excellent in durability.

What we claim is:

1. An organic electroluminescent device having a hole-transport layer, which is formed by applying and drying a coating solution in which a hole-transport material and a resin binder having a glass transition temperature of not less than 170° C. are dissolved in a solvent from which dissolved gas is previously removed.

2. An organic electroluminescent device according to claim 1, wherein the resin binder is at least one member selected from the group consisting of a polyethersulfone having a repeating unit of the formula:

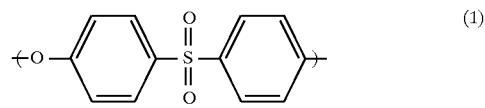

and a polysulfone having a repeating unit of the formula:

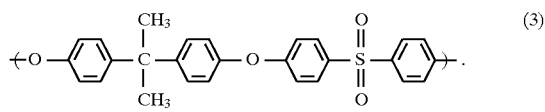

3. An organic electroluminescent device according to claim 1, wherein the hole-transport material is an N,N'-diphenyl-N,N'-bis(3-methylphenyl)-1,1'-biphenyl-4,4'-diamine of the formula:

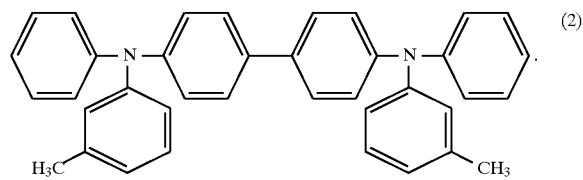

4. An organic electroluminescent device according to claim 1, wherein the hole-transport material is present in an amount of 40 to 60% by weight with respect to an entire hole-transport layer.

5. An organic electroluminescence device according to claim 1, further including an electro-transport layer formed by depositing by vacuum deposition an electron-transport material onto the hole-transport layer.

6. An organic electroluminescence device according to claim 5, wherein the electron-transport material constituting the electron-transport layer is a tris(8-quinolinolato) aluminum (III) complex of the formula:

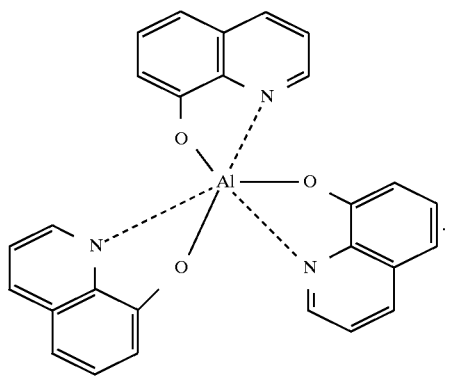

(4)

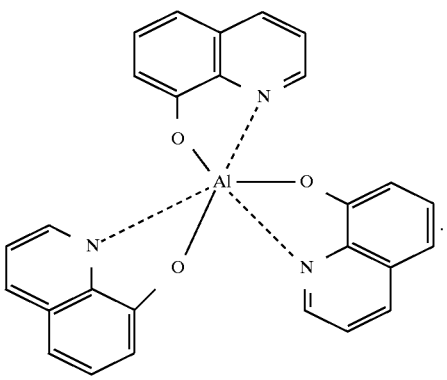

(4)

7. An organic electroluminescent device comprising:

a hole-transport layer having a layer structure that a hole-transport material is dispersed in a resin binder having a glass transition temperature of not less than 170° C.; and an electron-transport layer which is formed by depositing by vacuum deposition an electron-transport material onto the hole-transport material onto the hole-transport layer.

8. An organic electroluminescent device according to claim 7, wherein the resin binder constituting the hole-transport layer is at least one member selected from the group consisting of a polyethersulfone having a repeating unit of the formula:

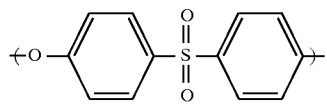

(1)

and a polysulfone having a repeating unit of the formula:

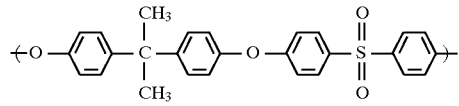

(3)

the hole-transport material is an N,N'-diphenyl-N,N'-bis (3-methylphenyl)-1,1'-biphenyl-4,4'-diamine of the formula:

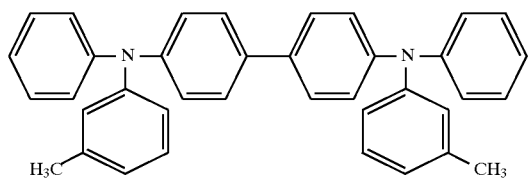

(2)

the electron-transport material constituting the electron-transport layer is a tris(8-quinolinolato)aluminum (III) complex of the formula:

9. An organic electroluminescent device according to claim 7, wherein the hole-transport material is present in an amount of 40 to 60% by weight with respect to the entire hole-transport layer.

10. An organic electroluminescence device having a hole-transport layer in which a hole-transport material and at least one fluorescent dye are dispersed in a resin binder having a glass transition temperature of not less than 170° C.

11. An organic electroluminescent device according to claim 10, wherein the resin binder constituting the hole-transport layer is at least one member selected from the group consisting of a polyethelsulfone having a repeating unit of the formula:

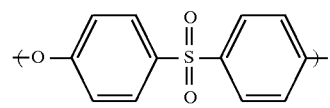

(1)

and a polysulfone having a repeating unit of the formula:

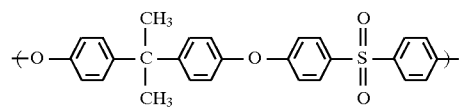

(3)

the hole-transport material is an N,N'-diphenyl-N,N'bis (3-methylphenyl)-1,1'-biphenyl-4,4'-diamine of the formula:

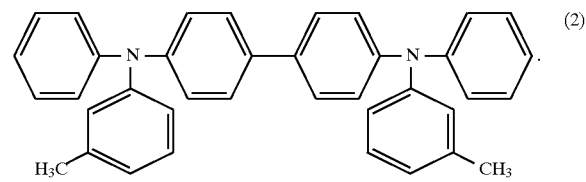

(2)

12. An organic electroluminescent device according to claim 10, wherein the hole-transport material is present in an amount of 40 to 60% by weight with respect to the entire hole-transport layer.

13. An organic electroluminescent device according to claim 10, wherein (a) a tetraphenylbutadiene of the formula:

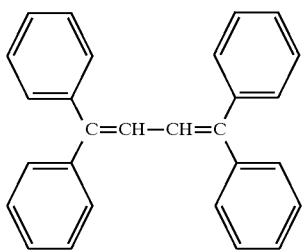
(7)

(b) a coumarine 6 of the formula:

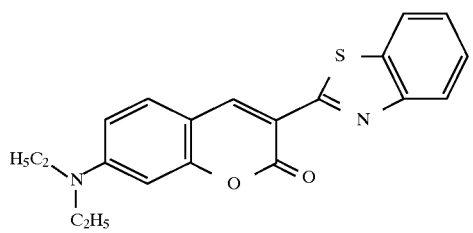
(8)

(c) a 4-dicyanomethylene-2-methyl-6-p-dimethylaminostyryl-4H-pyran of the formula:

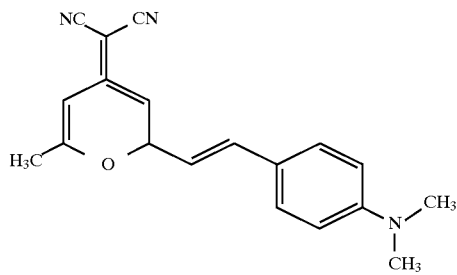
(9)

are employed with respect to the fluorescent dye.

14. An organic electroluminescent device according to claim 10, wherein a first electron-transport layer composed of an electron-transport material excellent in hole-blocking property and a second electron-transport layer composed of an electron-transport material are laminated in this order on the hole-transport layer.

15. An organic electroluminescent device according to claim 14, wherein the electron-transport material for the first electron-transport layer is a triazole compound of the formula:

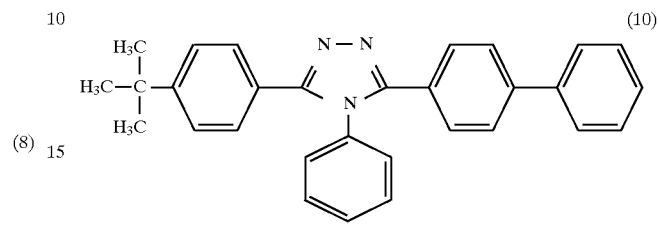
(10)

and the electron-transport material for the second electron-transport layer is a tris(8-quinolinolato)aluminum (III) complex of the formula:

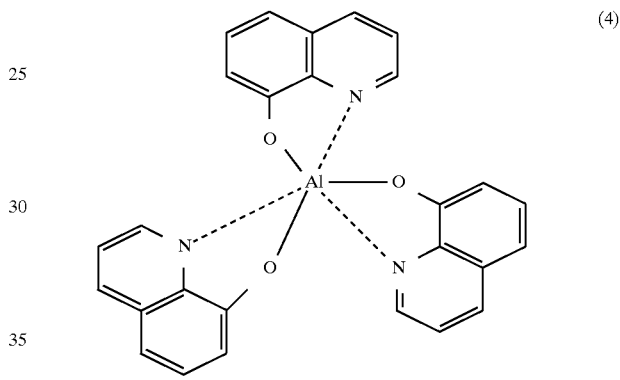
(4)

* * * * *